(12) United States Patent
Ecton et al.

(10) Patent No.: US 11,948,848 B2
(45) Date of Patent: Apr. 2, 2024

(54) SUBTRACTIVE ETCH RESOLUTION IMPLEMENTING A FUNCTIONAL THIN METAL RESIST

(71) Applicant: Intel Corporation, Santa Clara, CA (US)

(72) Inventors: Jeremy Ecton, Gilbert, AZ (US); Oscar Ojeda, Chandler, AZ (US); Leonel Arana, Phoenix, AZ (US); Suddhasattwa Nad, Chandler, AZ (US); Robert May, Chandler, AZ (US); Hiroki Tanaka, Chandler, AZ (US); Brandon C. Marin, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1024 days.

(21) Appl. No.: 16/274,091

(22) Filed: Feb. 12, 2019

(65) Prior Publication Data

US 2020/0258800 A1 Aug. 13, 2020

(51) Int. Cl.
*H01L 23/31* (2006.01)
*H01L 21/283* (2006.01)
*H01L 23/498* (2006.01)
*H05K 1/02* (2006.01)
*H05K 3/06* (2006.01)

(52) U.S. Cl.
CPC ........ *H01L 23/3114* (2013.01); *H01L 21/283* (2013.01); *H05K 1/0296* (2013.01); *H05K 3/061* (2013.01)

(58) Field of Classification Search
CPC ........... H01L 21/4857; H01L 21/32139; H01L 21/76885; H01L 23/522; H01L 23/538; H01L 23/49838; H01L 23/49822; H01L 23/498; H01L 23/53223; H01L 23/53266; H01L 23/53295; H05K 3/062
See application file for complete search history.

(56) References Cited

U.S. PATENT DOCUMENTS

| | | | | |
|---|---|---|---|---|
| 4,568,411 A | * | 2/1986 | Martin | G03F 7/095 204/192.15 |
| 5,975,409 A | * | 11/1999 | Brofman | H01L 24/75 228/19 |
| 6,402,970 B1 | * | 6/2002 | Lin | H01L 23/49811 216/13 |
| 2002/0093098 A1 | * | 7/2002 | Barr | H01L 21/76849 257/E21.585 |
| 2007/0045869 A1 | * | 3/2007 | Ho | H01L 24/81 257/E21.511 |
| 2009/0233436 A1 | * | 9/2009 | Kim | H01L 24/16 257/E21.476 |

(Continued)

FOREIGN PATENT DOCUMENTS

GB 0145272 * 6/1985 ............. H01L 21/00

*Primary Examiner* — Mohsen Ahmadi
(74) *Attorney, Agent, or Firm* — Schwabe, Williamson & Wyatt, P.C.

(57) ABSTRACT

Embodiments disclosed herein include electronic packages and methods of forming such packages. In an embodiment, the electronic package comprises a substrate and a conductive feature over the substrate. In an embodiment, a metallic mask is positioned over the conductive feature. In an embodiment, the metallic mask extends beyond a first edge of the conductive feature and a second edge of the conductive feature.

25 Claims, 9 Drawing Sheets

(56) References Cited

U.S. PATENT DOCUMENTS

| | | | | |
|---|---|---|---|---|
| 2010/0323474 | A1* | 12/2010 | Miyazaki | H05K 1/113 |
| | | | | 257/E21.507 |
| 2012/0049346 | A1* | 3/2012 | Lin | H01L 24/13 |
| | | | | 257/737 |
| 2015/0382463 | A1* | 12/2015 | Kim | H05K 3/4007 |
| | | | | 29/829 |
| 2017/0207161 | A1* | 7/2017 | Lin | H01L 23/49838 |
| 2018/0174981 | A1* | 6/2018 | Lu | H01L 23/13 |
| 2018/0211921 | A1* | 7/2018 | Lee | H01L 21/76849 |
| 2018/0254240 | A1* | 9/2018 | Tsai | H01L 23/49811 |
| 2019/0096869 | A1* | 3/2019 | Kim | H01L 23/5389 |
| 2020/0235005 | A1* | 7/2020 | Smythe | H01L 29/42376 |
| 2020/0235286 | A1* | 7/2020 | Marchack | H01L 43/08 |

* cited by examiner

SUBTRACTIVE ETCH RESOLUTION IMPLEMENTING A FUNCTIONAL THIN METAL RESIST

TECHNICAL FIELD

Embodiments of the present disclosure relate to electronic packaging, and more particularly, to conductive features over a substrate that comprise a metallic mask over surfaces of the conductive features.

BACKGROUND

The subtractive etch patterning process in the manufacture of package substrates typically utilizes a wet etching process. Wet etching comprises applying an impinging liquid spray of copper etchant through a pressurized nozzle orifice onto predefined exposed copper regions. The predefined exposed copper regions are typically bounded by a dry film resist (DFR) that is defined with a photolithographic process. Conventionally, the copper etchant is an acidic chemistry (e.g., cupric chloride, ferric chloride, etc.). The acidic etchant is needed in order to provide adequate etch selectivity between the copper and the DFR.

However, the use of such subtractive patterning processes does not scale well to fine line/space architectures. Particularly, such subtractive patterning processes are limited in the minimum space resolved (MSR). The MSR is limited due to several factors. One factor is the slow etch rate that is attainable with acidic etch chemistries. The slow etch rate provides a highly isotropic etch, and therefore, generates a significant undercut below the DFR. Another factor is the limitations of the minimum attainable thickness of the DFR. Reducing the thickness of the DFR increases the resolution of the etching process. However, the minimum thickness of the DFR (while maintaining adequate thickness uniformity) is currently approximately 10 microns. Since the thickness of the DFR is currently already at its lower limit, further resolution improvements cannot be obtained by reducing the thickness of the DFR.

EMBODIMENTS OF THE PRESENT DISCLOSURE

Described herein are electronic packages that comprise conductive features with a metallic mask over a top surface of the conductive features, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, current subtractive patterning processes have a limited minimum space resolved (MSR) due to the thickness of the dry film resist (DFR) and the low etch rate of acidic etching chemistries. Accordingly, embodiments disclosed herein provide a metallic mask over the conductive layer that has a thickness less than 10 microns. Additionally the substitution of a metallic material for the DFR allows for different etch chemistries to be used. In a particular embodiment, a basic chemistry (e.g., an alkaline chemistry) may be used as the etchant. This allows for improved MSR because alkaline chemistries typically provide a higher etch rate of copper compared to acidic etchants. Accordingly, the MSR of subtractive etching processes disclosed herein are improved because the thickness of the mask is reduced and/or an etchant with a higher etch rate is used compared to previous subtractive patterning processes such as those described above.

Furthermore, whereas DFR resist layers are removed subsequent to subtractively patterning the underlying conductive layer, embodiments disclosed herein retain the mask subsequent to subtractively patterning the underlying conductive layer. That is, the mask remains as part of the final structure after the fabrication is completed and is visible during a cross-sectional analysis of the device.

Figure 1A:
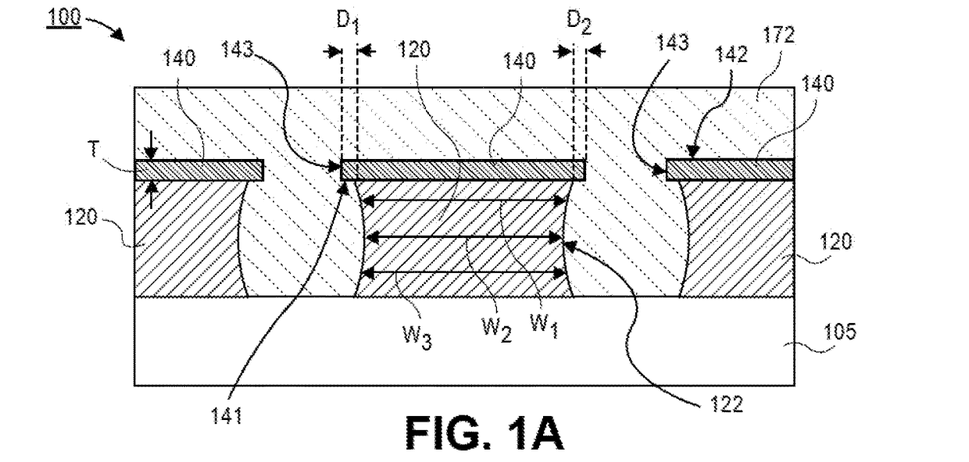
FIG. 1A is a cross-sectional illustration of a conductive feature on a substrate and a metallic mask over a top surface of the conductive feature, in accordance with an embodiment.

Referring now to FIG. 1A, a cross-sectional illustration of an electronic package 100 is shown, in accordance with an embodiment. In an embodiment, the electronic package 100 may comprise a substrate 105. The substrate 105 may be any substrate suitable for packaging applications. For example, the substrate 105 may be a dielectric layer (e.g., a build-up layer), a core layer (i.e., a core of a cored package), or the like. In the illustrated embodiment, the substrate 105 is shown as being a monolithic layer. However, it is to be appreciated that the substrate 105 may comprise traces, vias, or any other embedded component.

In an embodiment, a conductive feature 120 may be positioned over the substrate 105. The conductive feature 120 may be a single material layer, or may be formed from several layers, including seed layers, and fill layers. Any suitable deposition process, such as electroplating, chemical vapor deposition, or physical vapor deposition may be used to form conductive feature 120. In an embodiment, the conductive feature 120 comprises a conductive material such as, but not limited to, copper or alloys thereof. In an embodiment, the conductive feature 120 may be a trace (also referred to as a wire, line, metal, or simply interconnect), a pad, or the like.

In an embodiment, the conductive feature 120 may have a non-uniform width. For example, the width of the conductive feature 120 may have a first width $W_1$ proximate to a top portion of the conductive feature 120, a second width $W_2$ proximate to a middle portion of the conductive feature 120, and a third width $W_3$ proximate to a bottom portion of the conductive feature 120. In an embodiment, second width $W_2$ may be smaller than the first width $W_1$ and the third width $W_3$. Such an embodiment may be referred to as having an "hour-glass shaped cross-section". The non-uniform widths of the conductive feature 120 produce a sidewall surface 122 that has a non-vertical profile. For example, the sidewall surface 122 may have a concave profile.

In an embodiment, a mask 140 is positioned over the conductive feature 120. The mask 140 has a thickness T that provides an improved MSR. For example, the mask 140 may have a thickness T that is 10 microns or less, 5 microns or less, or 2 microns or less. The thickness T of the mask 140 may be reduced relative to the minimum thickness of DFR materials. In a particular embodiment, the mask 140 may be a metallic mask 140. The use of a metallic material for the mask 140 allows for thin layers to be provided. Particularly, metallic layers may be deposited with thin film deposition processes (e.g., plating, sputtering, or the like) that provide superior thickness uniformity. In contrast, DFR materials are typically applied with a lamination process that is not suitable for thin films and provides relatively poor thickness uniformity. In an embodiment, the mask 140 may comprise nickel, lead, tin, titanium, gold, iron, cobalt, manganese, chromium or other metallic materials that have an etch selectivity relative to the conductive feature 120 in an alkaline etch chemistry. The mask may also be deposited onto a thin conductive polymer (not shown) or the like to prevent direct, physical intimate contact between the metal mask and underlying patterned metal feature, thereby avoiding a potential source of corrosion.

In an embodiment, the mask 140 extends beyond the sidewall surfaces 122 of the conductive feature 120. That is, the mask 140 may exhibit an undercut. For example, portions of a bottom surface 141 of the mask 140 may not be covered by the top surface of the conductive feature 120. In an embodiment, the mask 140 may have a first undercut that is a first distance $D_1$ along one edge of the conductive feature 120 and a second undercut that is a second distance $D_2$ along an opposite edge of the conductive feature 120. In an embodiment, the first distance $D_1$ and the second distance $D_2$ may be substantially equal to each other. In other embodiment, the first distance $D_1$ and the second distance $D_2$ may be non-uniform. In an embodiment, the first distance $D_1$ and the second distance $D_2$ may be approximately 3 microns or less or 1 micron or less.

In an embodiment, the lateral space between sidewall surfaces 122 of neighboring conductive features 120 is filled with a dielectric layer 172 (e.g., a laminated dielectric layer typical of package substrate fabrication, a solder resist layer, or the like). In an embodiment, the dielectric layer 172 fills the space between sidewall surfaces 122 of the conductive features 120 and conforms to the surfaces of the mask 140. For example, the dielectric layer 172 may be in contact with a top surface 142 of the mask 140, sidewall surfaces 143 of the mask 140, and the portion of the bottom surface 141 of the mask 140 not covered by the conductive feature 120.

Figure 1B:
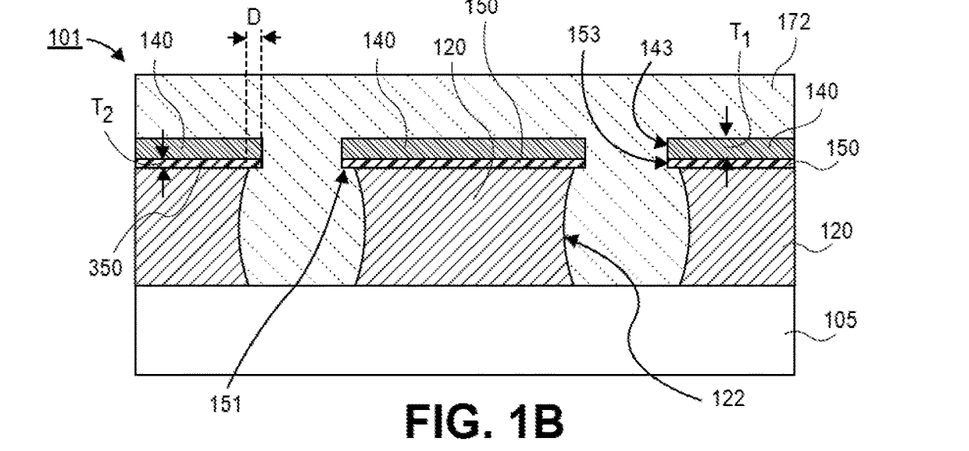
FIG. 1B is a cross-sectional illustration of a conductive feature on a substrate with a barrier layer and a metallic mask over a top surface of the conductive feature, in accordance with an embodiment.

Referring now to FIG. 1B, a cross-sectional illustration of an electronic package 101 is shown, in accordance with an additional embodiment. The electronic package 101 may be substantially similar to the electronic package 100 illustrated in FIG. 1A, with the exception that a barrier layer 150 is positioned between the conductive feature 120 and the mask 140. In an embodiment, the barrier layer 150 may be a material that limits or eliminates chemical interaction between the mask 140 and the conductive feature 120 (e.g., to minimize or prevent corrosion, diffusion, or the like). In an embodiment, the barrier layer 150 may comprise tin, gold, titanium, iron, cobalt, indium, conductive polymers such as, polyalykthiophenes (e.g., poly (3,4-ethylenedioxythiophene), polystyrene sulfonate (PEDOT-PSS)), polyacetylene, polyphenylene vinylene, polypyrrole, polyaniline, polyindoles, polyazoles, graphene, or the like.

In an embodiment, the mask 140 may have a first thickness $T_1$ and the barrier layer 150 may have a second thickness $T_2$. In an embodiment, the first thickness $T_1$ may be greater than the second thickness $T_2$. For example, the first thickness $T_1$ may be 10 microns or less, and the second thickness $T_2$ may be 5 microns or less. In an additional embodiment, the first thickness $T_1$ may be 5 microns or less, and the second thickness $T_2$ may be 2 microns or less. In other embodiments, the first thickness $T_1$ may be substantially equal to the second thickness $T_2$ or the first thickness $T_1$ may be less than the second thickness $T_2$.

In an embodiment, the barrier layer 150 may have a footprint that is substantially the same as the footprint of the mask 140. That is, sidewall surfaces 153 of the barrier layer 150 may be substantially coplanar with sidewall surfaces 143 of the mask 140. While barrier layers have been used over conductive features in packaging applications previously, it is to be appreciated that such barrier layers will exhibit a footprint that matches the top surface of the conductive feature 120 instead of the mask 140. That is, there is no undercut between the barrier layer 150 and the conductive feature 120. In contrast, those skilled in the art will recognize that the method of forming the barrier layer 150 described in embodiments herein provides a barrier layer 150 that does exhibit an undercut. For example, portions of the bottom surface 151 of the barrier layer 150 is not covered by the top surface of the conductive feature 120. Particularly, the undercut may have a distance D, similar to the first distance $D_1$ and second distance $D_2$ described above with respect to FIG. 1A (e.g., less than 3 microns or less than 1 micron). In an embodiment, the dielectric layer 172 may conform to sidewall surfaces 153 of the barrier layer 150 and over the portion of the bottom surface 151 of the barrier layer 150 not covered by the conductive feature 120.

Figure 1C:
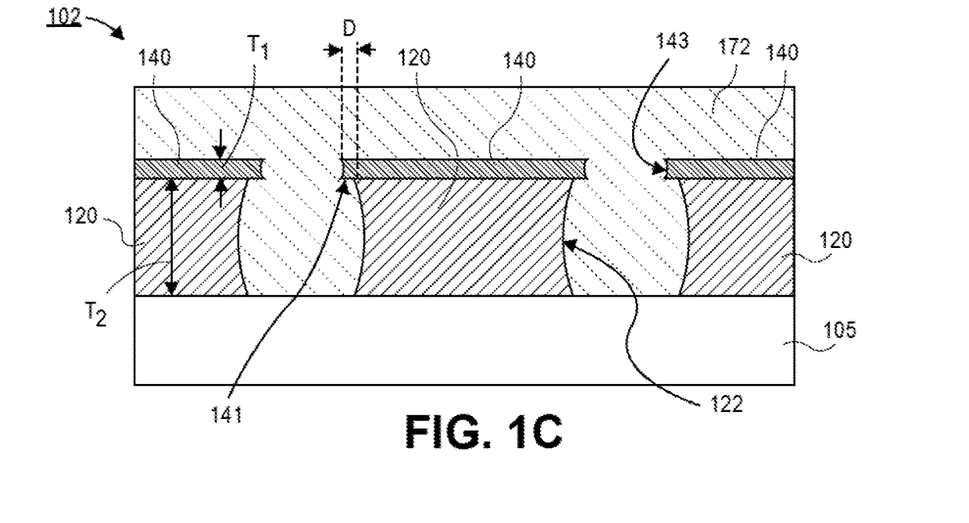
FIG. 1C is a cross-sectional illustration of a conductive feature on a substrate and a metallic mask with non-vertical sidewalls formed over a top surface of the conductive feature, in accordance with an embodiment.

Referring now to FIG. 1C, a cross-sectional illustration of an electronic package 102 is shown, in accordance with an additional embodiment. In an embodiment, the electronic package 102 may be substantially similar to the electronic package 100 illustrated in FIG. 1A, with the exception that sidewall surfaces 143 of the mask 140 are not substantially vertical. In an embodiment, the sidewall surfaces 143 may be characterized with a curved profile characteristic of a wet etching process. For example, the mask 140 may be referred to as having an hour-glass shaped cross-section, similar to the cross-section of the conductive feature 120. While similar in shape, it is to be appreciated that the curvature of the sidewall surfaces 143 of the mask 140 may generally be less severe than the curvature of the sidewall surfaces 122 of the conductive feature 120. This is because the thickness $T_1$ of the mask 140 is substantially smaller than the thickness $T_2$ of the conductive feature 120. As such, the isotropic nature of wet etches used to form the mask 140 and the conductive feature 120, have different lateral effects. That is, the conductive feature 120 is more susceptible to lateral etching than the mask 140 since the conductive feature 120 is thicker than the mask 140. In an embodiment, the first thickness $T_1$ of the mask 140 may be 10 microns or less or 5 microns or less, and a second thickness $T_2$ of the conductive feature 120 may be between 10 microns and 35 microns.

Referring now to FIGS. 2A-2F, a series of cross-sectional illustrations of a process for forming an electronic package 200 with a conductive feature 220 and an overlying mask 240 is shown, in accordance with an embodiment.

Figure 2A:
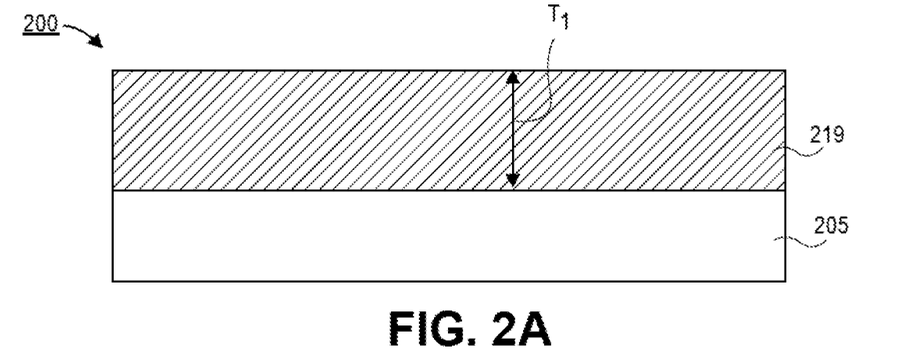
FIG. 2A is a cross-sectional illustration of a conductive layer over a substrate, in accordance with an embodiment.

Referring now to FIG. 2A, a cross-sectional illustration of an electronic package 200 is shown, in accordance with an embodiment. In an embodiment, the electronic package 200 may comprise a substrate 205 and a conductive layer 219 over the substrate 205. The substrate 205 may be substantially similar to the substrate 105 described above with respect to FIG. 1A. In an embodiment, the conductive layer 219 may be a blanket layer of conductive material disposed over the surface of the substrate 205. For example, the conductive material may be deposited with a plating process (e.g., electroplating or electroless plating) or any other suitable deposition process. In an embodiment, the conductive layer 219 may have a first thickness $T_1$. For example, the first thickness $T_1$ of the conductive layer 219 may be between approximately 10 microns and 35 microns.

Figure 2B:
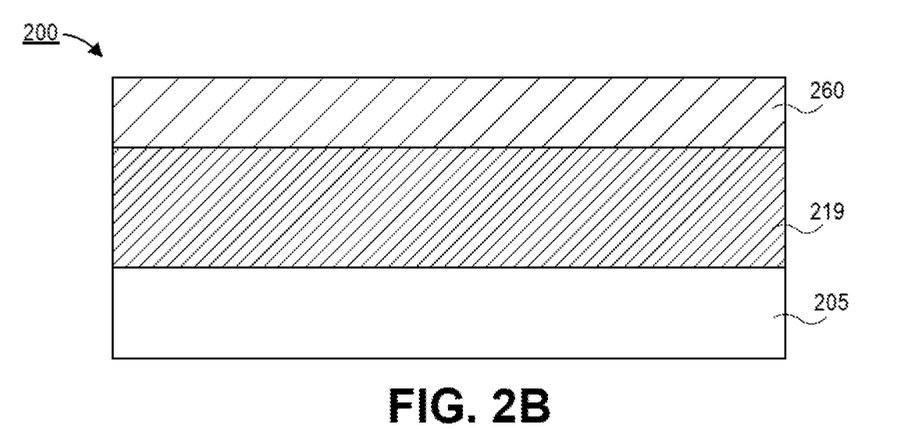
FIG. 2B is a cross-sectional illustration of FIG. 2A after a resist layer is disposed over a top surface of the conductive layer, in accordance with an embodiment.

Referring now to FIG. 2B, a cross-sectional illustration after a resist layer 260 is disposed over the conductive layer 219 is shown, in accordance with an embodiment. In an embodiment, the resist layer 260 may be any suitable resist material used in conjunction with lithographic patterning. For example, the resist layer 260 may be a DFR or the like. The resist layer 260 may be disposed over the conductive layer 219 with any suitable process (e.g., lamination, spin coating, or the like).

Figure 2C:
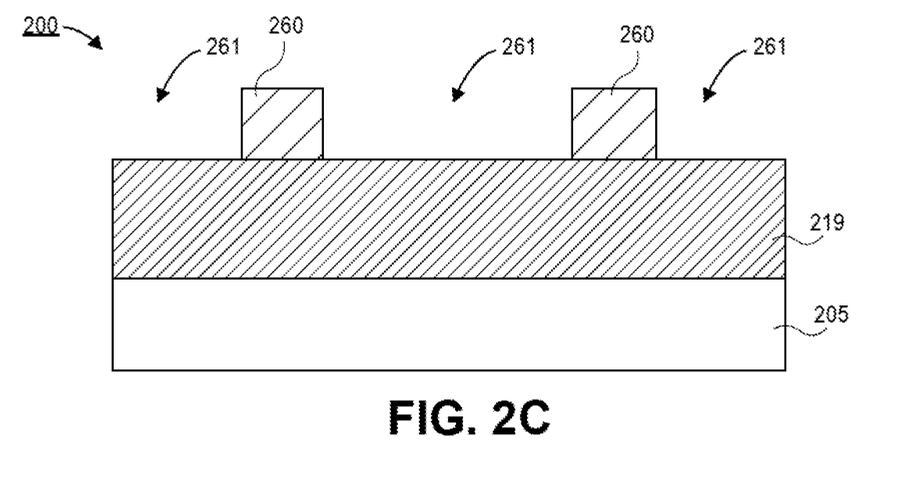
FIG. 2C is a cross-sectional illustration of FIG. 2B after the resist layer is patterned, in accordance with an embodiment.

Referring now to FIG. 2C, a cross-sectional illustration after the resist layer 260 is patterned is shown, in accordance with an embodiment. In an embodiment, the resist layer 260 may be patterned with a lithographic patterning operation. For example, a photoresist (not shown) may be deposited over the resist layer 260, patterned, and used to transfer the pattern into the resist layer 260. In other embodiments, the resist layer 260 may be a photoimageable dielectric and the photoresist may be omitted.

In an embodiment, the pattern transferred into the resist layer 260 may be the desired pattern of the conductive features that will be patterned into the conductive layer 219 in a subsequent processing operation. That is, openings 261 in the resist layer 260 may be located above the positions where conductive features are desired.

Figure 2D:
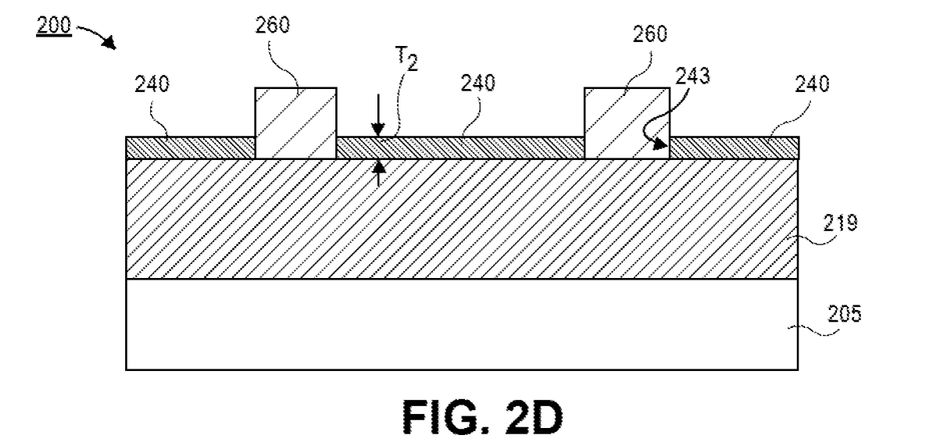
FIG. 2D is a cross-sectional illustration of FIG. 2C after a metallic mask is disposed over the top surface of the conductive layer, in accordance with an embodiment.

Referring now to FIG. 2D, a cross-sectional illustration after the mask 240 is disposed over a top surface of the conductive layer 219 is shown, in accordance with an embodiment. In an embodiment, the mask 240 may be in direct contact with a top surface of the conductive layer 219. The mask 240 may be a metallic mask 240. For example, the mask 240 may comprise one or more of nickel, lead, tin, titanium, gold, iron, cobalt and any other metallic material that has an etch selectivity to the conductive layer 219 in an acid or alkaline etching chemistry.

In an embodiment, the mask 240 may have a second thickness Ta. The second thickness Ta may be suitable to provide a low MSR. For example, the second thickness Ta may be 10 microns or less or 5 microns or less. In an embodiment, the small thickness Ta may be achieved by using deposition processes suitable for thin film deposition. For example, the mask 240 may be deposited with a plating process, a sputtering process, chemical vapor deposition (CVD), or the like. Since an additive process is used to fabricate the mask 240, sidewall surfaces 243 of the mask 240 may conform to the sidewalls of the resist layer 260. For example, when the sidewalls of the resist layer 260 are substantially vertical, sidewall surfaces 243 of the mask 240 will also be substantially vertical.

Figure 2E:
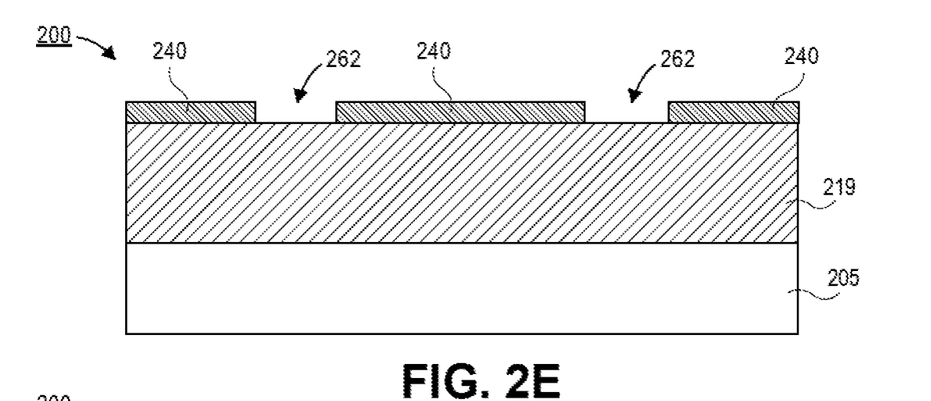
FIG. 2E is a cross-sectional illustration of FIG. 2D after the resist is removed from the top surface of the conductive layer, in accordance with an embodiment.

Referring now to FIG. 2E, a cross-sectional illustration after the resist layer 260 is removed is shown, in accordance with an embodiment. In an embodiment, the removal of the resist layer 260 provides openings 262 through the mask 240 and exposes a top surface of the conductive layer 219. In an embodiment, the resist layer 260 may be removed with any suitable process (e.g., ashing, stripping, or the like).

Figure 2F:
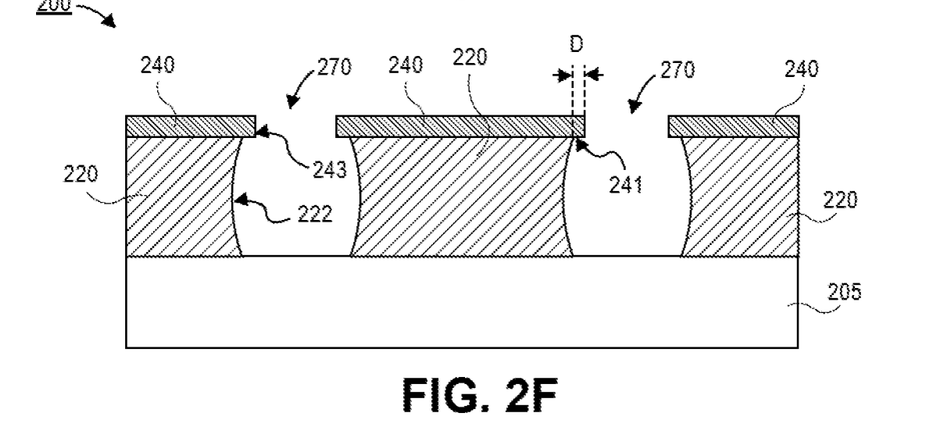
FIG. 2F is a cross-sectional illustration of FIG. 2E after the metallic mask protects a portion of the conductive layer during a subtractive etching process to provide a conductive feature patterned into the conductive layer, in accordance with an embodiment.

Referring now to FIG. 2F, a cross-sectional illustration after the conductive layer 219 is patterned to form conductive features 220 is shown, in accordance with an embodiment. In an embodiment, the conductive layer 219 may be patterned with a subtractive patterning process. In a particular embodiment, the conductive layer 219 is patterned using a wet etching chemistry with the mask 240 defining the pattern transferred into the conductive layer 219.

In order to provide improved MSR, an alkaline etching chemistry is used to pattern the conductive layer 219. However, in some embodiments, an acidic etching chemistry may also be used. For example, the etching chemistry may include one or more of ammoniacal or ammonium chloride, ferric chloride, cupric chloride, sodium persulfate, ammonium persulfate, ammonium hydroxide, and all other ammoniacal halides. The use of an alkaline etching chemistry provides an etch rate of the conductive layer 219 (e.g., copper) that is typically faster than the etch rate of copper using standard acidic etching chemistry. In particular, ammoniacal chloride exhibits a faster etch rate of copper compared to using a standard acid cupric chloride etching chemistry. The increased etch rate reduces lateral etching and minimizes the undercut below the mask 240. Furthermore, the thin mask 240 improves the chemical transfer into the space between the mask 240. This provides a more efficient etch that reduces lateral etching, and therefore, improves MSR.

However, it is to be appreciated that even with the improvements in etch rate and etch efficiency provided by the use of an alkaline etchant and/or a thin metallic mask 240, some amount of undercut will still be present. Accordingly, a portion of the bottom surface 241 of the mask 240 may be exposed. In an embodiment, the mask 240 may extend beyond the sidewall surfaces 222 of the conductive feature 220 a distance D. For example, the distance D may be 3 microns or less, or 1 micron or less. Additionally, the small degree of lateral etching may result in sidewall surfaces 222 of the conductive features 220 may be non-vertical. For example, the sidewall surfaces 222 of the conductive features 220 may have concave profiles. The concave profiles of the sidewall surfaces 222 may result in the conductive features 220 having an hour-glass shaped cross section.

Following the patterning of the conductive layer 219 to form conductive features 220, a dielectric layer (not shown) may be disposed over the device to provide a structure substantially similar to the electronic package 100 illustrated in FIG. 1A. For example, a dielectric layer may fill the spaces 270 between the conductive features 220 and conform to the exposed surfaces of the mask 240.

Figure 3A:
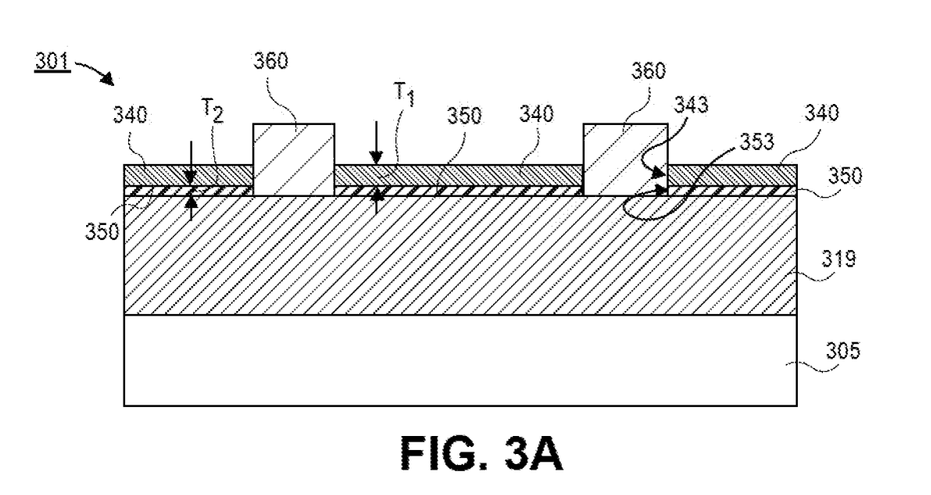
FIG. 3A is a cross-sectional illustration of FIG. 2C after a barrier layer and a metallic mask are disposed over the top surface of the conductive layer, in accordance with an embodiment.
Figure 3B:
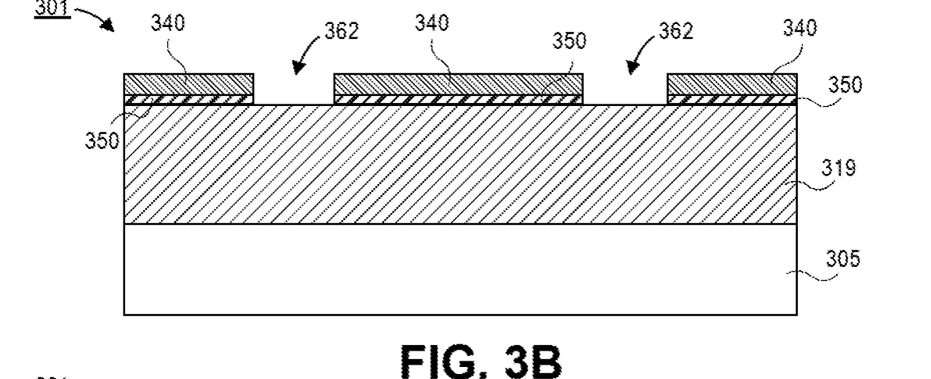
FIG. 3B is a cross-sectional illustration of FIG. 3A after the resist is removed from the top surface of the conductive layer, in accordance with an embodiment.
Figure 3C:
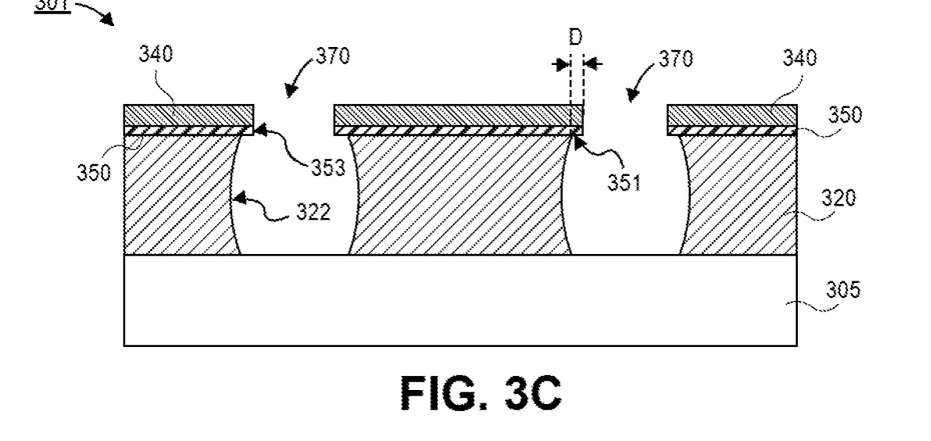
FIG. 3C is a cross-sectional illustration of FIG. 3B after the metallic mask and the barrier layer protect a portion of the conductive layer during a subtractive etching process to provide a conductive feature patterned into the conductive layer, in accordance with an embodiment.

Referring now to FIGS. 3A-3C, a series of cross-sectional illustrations that depict a process for forming an electronic package 301 with a conductive feature 320 and an overlying barrier layer 350 and mask 340 is shown, in accordance with an embodiment.

Referring now to FIG. 3A, a cross-sectional illustration of an electronic package 301 is shown, in accordance with an embodiment. The electronic package 301 may be substantially similar to the electronic package 200 in FIG. 2D and formed with substantially similar processing operations, with the exception that a barrier layer 350 is disposed between the conductive layer 319 and the mask 340. Particularly, the electronic package 301 may comprise a substrate 305 on which the conductive layer 319 is supported, and a patterned resist layer 360 may be positioned over the conductive layer 319 and between the barrier layer/mask 350/340 stack.

In an embodiment, the barrier layer 350 may be a material that prevents unwanted chemical interaction between the mask 340 and the conductive layer 319. For example, the barrier layer 350 may comprise one or more of tin, gold, conductive polymers, and the like. Since the barrier layer 350 and the mask 340 are deposited using the resist layer 360 as a mask, sidewall surfaces 353 of the barrier layer 350 and sidewall surfaces 343 of the mask 340 may be substantially coplanar. That is, a footprint of the barrier layer 350 matches the footprint of the mask 340.

In an embodiment, the mask 340 may have a first thickness $T_1$ and the barrier layer 350 may have a second thickness $T_2$. In an embodiment, the first thickness $T_1$ may be greater than the second thickness $T_2$. For example, the first thickness $T_1$ may be 10 microns or less, and the second thickness $T_2$ may be 5 microns or less. In an additional embodiment, the first thickness $T_1$ may be 5 microns or less, and the second thickness $T_2$ may be 2 microns or less. In other embodiments, the first thickness $T_1$ may be substantially equal to the second thickness $T_2$ or the first thickness $T_1$ may be less than the second thickness $T_2$.

Referring now to FIG. 3B, a cross-sectional illustration after the resist layer 360 is removed is shown, in accordance with an embodiment. In an embodiment, the removal of the resist layer 360 provides openings 362 through the barrier layer/mask 350/340 stack and exposes a top surface of the conductive layer 319. In an embodiment, the resist layer 360 may be removed with any suitable process (e.g., ashing, stripping, or the like).

In FIGS. 3A and 3B, the barrier layer/mask 350/340 stack is illustrated as being fabricated with an additive deposition process using the resist layer 360 as a mask. However, it is to be appreciated that embodiments are not limited to such configurations. For example, one or both of the barrier layer 350 and the mask 340 may be blanket deposited and subsequently etched (e.g., with a dry or wet etching chemistry) to provide the desired pattern. Such an embodiment may be referred to as a subtractive etching process.

Referring now to FIG. 3C, a cross-sectional illustration after the conductive layer 319 is patterned to form conductive features 320 is shown, in accordance with an embodiment. In an embodiment, the conductive layer 319 may be patterned with a subtractive patterning process. In a particular embodiment, the conductive layer 319 is patterned using a wet etching chemistry with the mask 340 defining the pattern transferred into the conductive layer 319.

In order to provide improved MSR, an alkaline etching chemistry is used to pattern the conductive layer 319. For example, the etching chemistry may include one or more of ammoniacal or ammonium chloride, ammonium persulfate, ammonium hydroxide, and all other ammoniacal halides. The use of an alkaline etching chemistry provides an etch rate of the conductive layer 319 (e.g., copper) that is typically faster than the etch rate of copper using standard acidic etching chemistry. In particular, ammoniacal chloride exhibits a faster etch rate of copper compared to using a standard acid cupric chloride etching chemistry. The increased etch rate reduces lateral etching and minimizes the undercut below the mask 340. However, in some embodiments, an acidic etching chemistry may also be used. Furthermore, the thin barrier layer/mask 350/340 stack improves the chemical transfer into the space between the barrier layer/mask 350/340 stack. This provides a more efficient etch that reduces lateral etching, and therefore, improves MSR.

However, it is to be appreciated that even with the improvements in etch rate and etch efficiency provided by the use of an alkaline etchant and/or a thin metallic mask 340, some amount of undercut will still be present. Accordingly, a portion of the bottom surface 351 of the barrier layer 350 may be exposed. In an embodiment, the barrier layer/mask 350/340 stack may extend beyond the sidewall surfaces 322 of the conductive feature 320 a distance D. For example, the distance D may be 3 microns or less, or 1 micron or less. Additionally, the small degree of lateral etching may result in sidewall surfaces 322 of the conductive features 320 may be non-vertical. For example, the sidewall surfaces 322 of the conductive features 320 may have concave profiles. The concave profiles of the sidewall surfaces 322 may result in the conductive features 320 having an hour-glass shaped cross section.

Following the patterning of the conductive layer 319 to form conductive features 320, a dielectric layer (not shown) may be disposed over the device to provide a structure substantially similar to the electronic package 101 illustrated in FIG. 1B. For example, a dielectric layer may fill the spaces 370 between the conductive features 320 and conform to the exposed surfaces of the barrier layer/mask 350/340 stack.

Referring now to FIGS. 4A-4F, a series of cross-sectional illustrations of a process for forming an electronic package 402 with a conductive feature 420 and an overlying mask 440 is shown, in accordance with an embodiment.

Figure 4A:
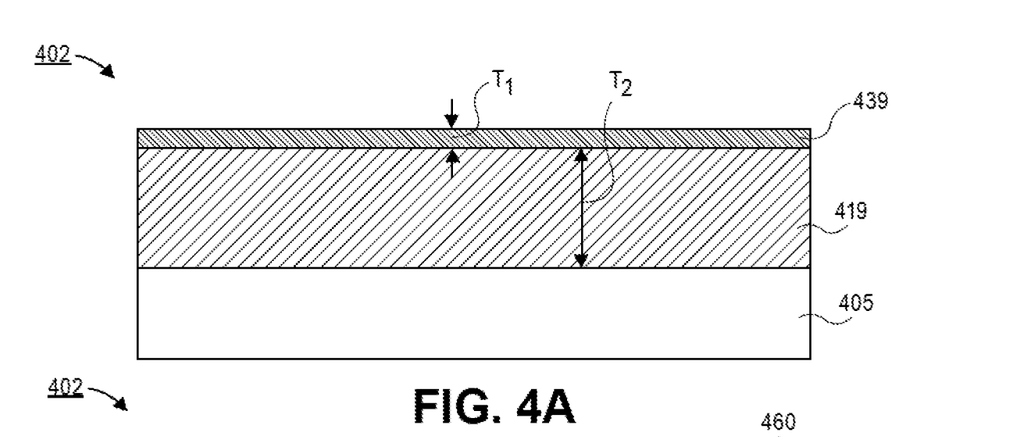
FIG. 4A is a cross-sectional illustration of a conductive layer over a substrate and an unpatterned metallic mask layer over the conductive layer, in accordance with an embodiment.

Referring now to FIG. 4A, a cross-sectional illustration of an electronic package 402 is shown, in accordance with an embodiment. In an embodiment, the electronic package 402 may comprise a substrate 405 and a conductive layer 419 over the substrate 405. The substrate 405 may be substantially similar to the substrate 105 described above with respect to FIG. 1A. In an embodiment, the conductive layer 419 may be a blanket layer of conductive material disposed over the surface of the substrate 405. For example, the conductive material may be deposited with a plating process (e.g., electroplating or electroless plating) or any other suitable deposition process.

In an embodiment, a mask layer 439 may be positioned over the conductive layer 419. The mask layer 439 may be blanket deposited across the entire top surface of the conductive layer 419. That is, the mask layer 439 is not patterned at this point in the process. In an embodiment, the mask layer 439 comprises a metallic material. For example, the mask layer 439 may comprise one or more of nickel, lead, and tin, and any other metallic materials that have an etch selectivity relative to the conductive layer 419 in an alkaline etch chemistry. In an embodiment, the mask layer 439 may have a first thickness $T_1$. The first thickness $T_1$ may be 10 microns or less, 5 microns or less, or 3 microns or less. In an embodiment, the conductive layer 419 may have a second thickness $T_2$. For example, the second thickness $T_2$ of the conductive layer 419 may be between approximately 10 microns and 35 microns.

Figure 4B:
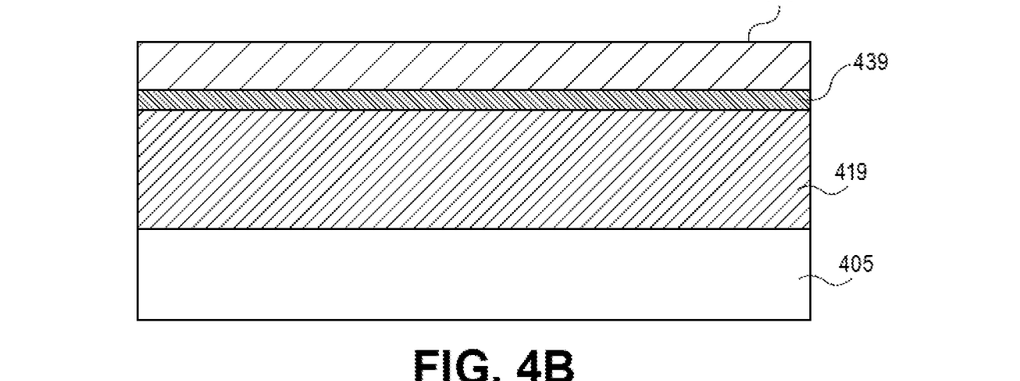
FIG. 4B is a cross-sectional illustration of FIG. 4A after a resist layer is disposed over the unpatterned metallic mask layer, in accordance with an embodiment.

Referring now to FIG. 4B, a cross-sectional illustration after a resist layer 460 is disposed over the mask layer 439 is shown, in accordance with an embodiment. In an embodiment, the resist layer 460 may be any suitable resist material used in conjunction with lithographic patterning. For example, the resist layer 460 may be a DFR or the like. The resist layer 460 may be disposed over the conductive layer 419 with any suitable process (e.g., lamination, spin coating, or the like).

Figure 4C:
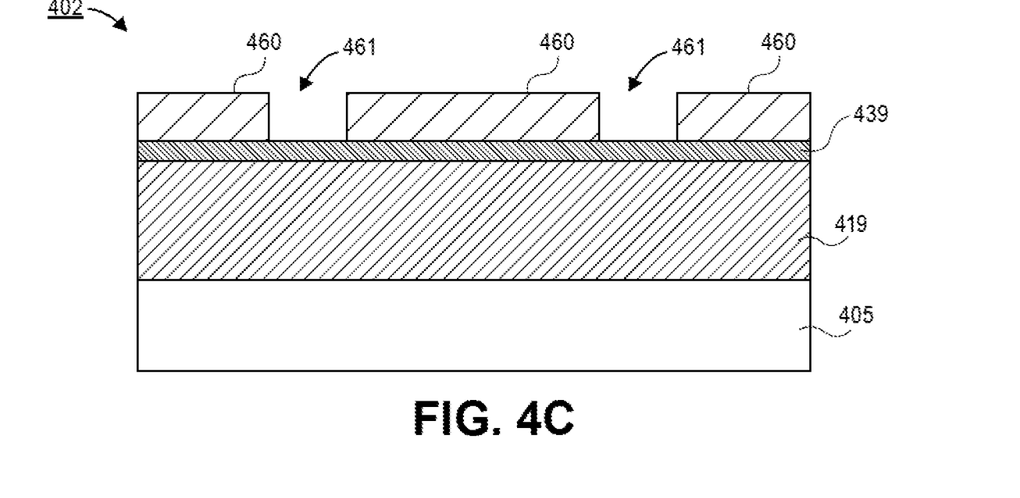
FIG. 4C is a cross-sectional illustration of FIG. 4B after the resist layer is patterned, in accordance with an embodiment.

Referring now to FIG. 4C, a cross-sectional illustration after the resist layer 460 is patterned is shown, in accordance with an embodiment. In an embodiment, the resist layer 460 may be patterned with a lithographic patterning operation. For example, a photoresist (not shown) may be deposited over the resist layer 460, patterned, and used to transfer the pattern into the resist layer 460. In other embodiments, the resist layer 460 may be a photoimageable dielectric and the photoresist may be omitted.

In an embodiment, the pattern transferred into the resist layer 460 may be a negative pattern of the desired pattern of the conductive features that will be patterned into the conductive layer 419 in a subsequent processing operation. That is, openings 461 in the resist layer 460 may be located above the position where spaces between neighboring conductive features are desired.

Figure 4D:
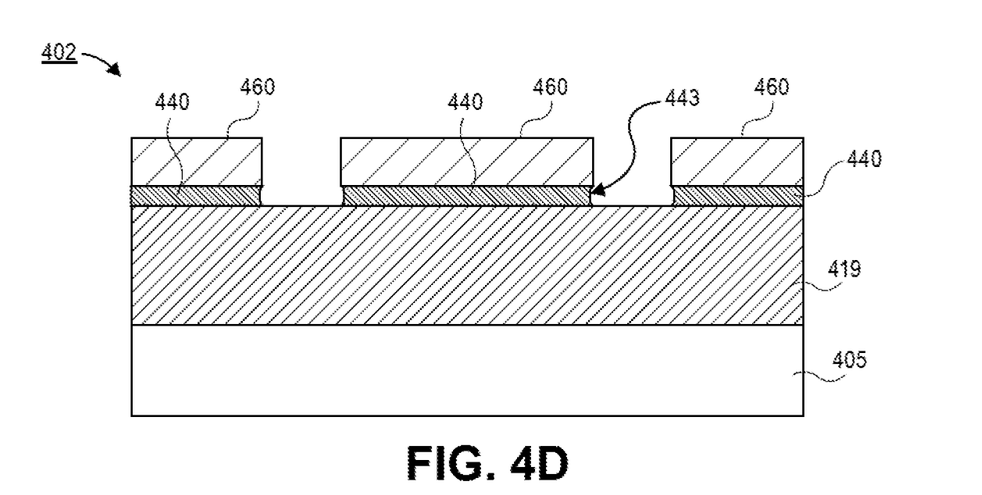
FIG. 4D is a cross-sectional illustration of FIG. 4C after the pattern in the resist layer is transferred into the metallic mask layer to provide a patterned metallic mask, in accordance with an embodiment.

Referring now to FIG. 4D, a cross-sectional illustration after the mask layer 439 is patterned to form a plurality of masks 440 is shown, in accordance with an embodiment. In an embodiment, the mask layer 439 may be patterned with a wet etching chemistry. Accordingly, the sidewall surfaces 443 of the masks 440 may comprise non-vertical sidewalls. That is, the sidewall surfaces 443 may have a concave profile. In some embodiments, the etching process to form the masks 440 may generate some amount of undercut below the resist layer 460.

Figure 4E:
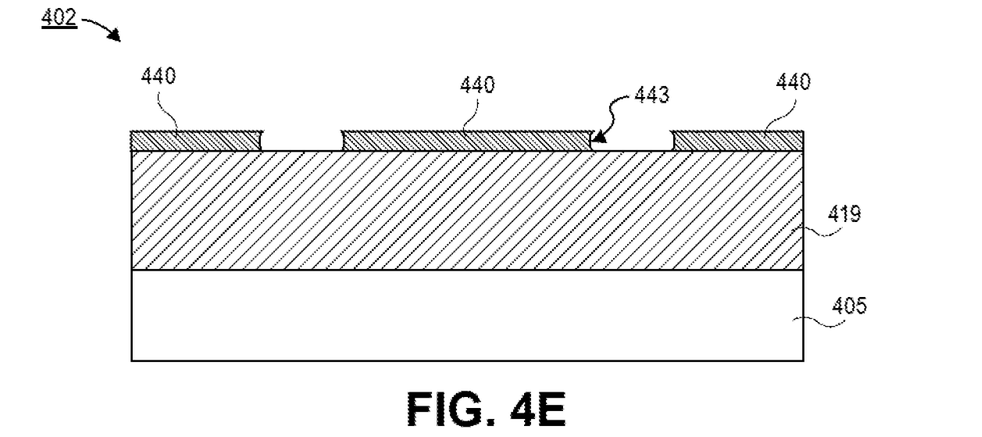
FIG. 4E is a cross-sectional illustration of FIG. 4D after the resist layer is removed, in accordance with an embodiment.

Referring now to FIG. 4E, a cross-sectional illustration after the resist layer 460 is removed is shown, in accordance with an embodiment. In an embodiment, the resist layer 460 may be removed with any suitable process (e.g., ashing, stripping, or the like).

Figure 4F:
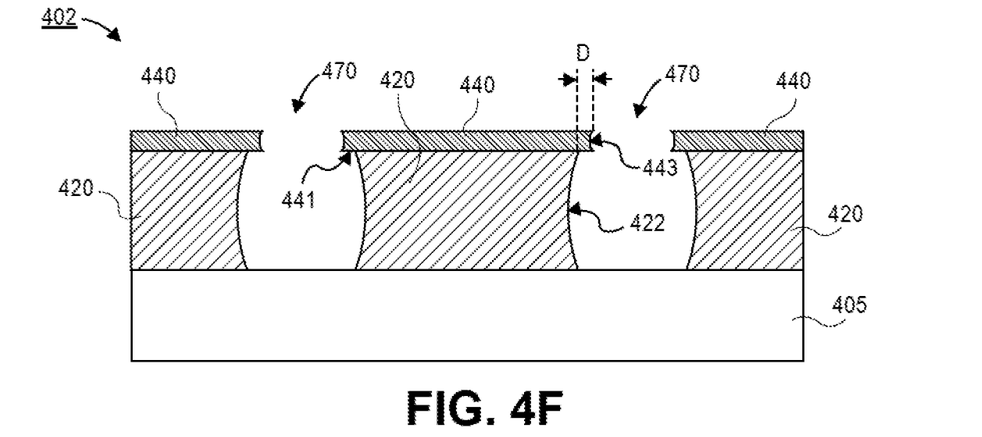
FIG. 4F is a cross-sectional illustration of FIG. 4E after the metallic mask protects a portion of the conductive layer during a subtractive etching process to provide a conductive feature patterned into the conductive layer, in accordance with an embodiment.

Referring now to FIG. 4F, a cross-sectional illustration after the conductive layer 419 is patterned to form conductive features 420 is shown, in accordance with an embodiment. In an embodiment, the conductive layer 419 may be patterned with a subtractive patterning process. In a particular embodiment, the conductive layer 419 is patterned using a wet etching chemistry with the mask 440 defining the pattern transferred into the conductive layer 419.

In order to provide improved MSR, an alkaline etching chemistry is used to pattern the conductive layer 419. For example, the etching chemistry may include one or more of ammoniacal or ammonium chloride, ammonium persulfate, ammonium hydroxide, and all other ammoniacal halides. The use of an alkaline etching chemistry provides an etch rate of the conductive layer 419 (e.g., copper) that is typically faster than the etch rate of copper using standard acidic etching chemistry. In particular, ammoniacal chloride exhibits a faster etch rate of copper compared to using a standard acid cupric chloride etching chemistry. The increased etch rate reduces lateral etching and minimizes the undercut below the mask 440. However, in some embodiments, an acidic etching chemistry may also be used. Furthermore, the thin mask 440 improves the chemical transfer into the space between the mask 440. This provides a more efficient etch that reduces lateral etching, and therefore, improves MSR.

However, it is to be appreciated that even with the improvements in etch rate and etch efficiency provided by the use of an alkaline etchant and/or a thin metallic mask 440, some amount of undercut will still be present. Accordingly, a portion of the bottom surface 441 of the mask 440 may be exposed. In an embodiment, the mask 440 may extend beyond the sidewall surfaces 422 of the conductive feature 420 a distance D. For example, the distance D may be 3 microns or less, or 1 micron or less. Additionally, the small degree of lateral etching may result in sidewall surfaces 422 of the conductive features 420 may be non-vertical. For example, the sidewall surfaces 422 of the conductive features 420 may have concave profiles. The concave profiles of the sidewall surfaces 422 may result in the conductive features 420 having an hour-glass shaped cross section. In an embodiment, the curvature of sidewall surfaces 422 of the conductive features 420 is greater than the curvature of the sidewall surfaces 443 of the mask 440.

Following the patterning of the conductive layer 419 to form conductive features 420, a dielectric layer (not shown) may be disposed over the device to provide a structure substantially similar to the electronic package 102 illustrated in FIG. 1C. For example, a dielectric layer may fill the spaces 470 between the conductive features 420 and conform to the exposed surfaces of the mask 440.

Figure 5:
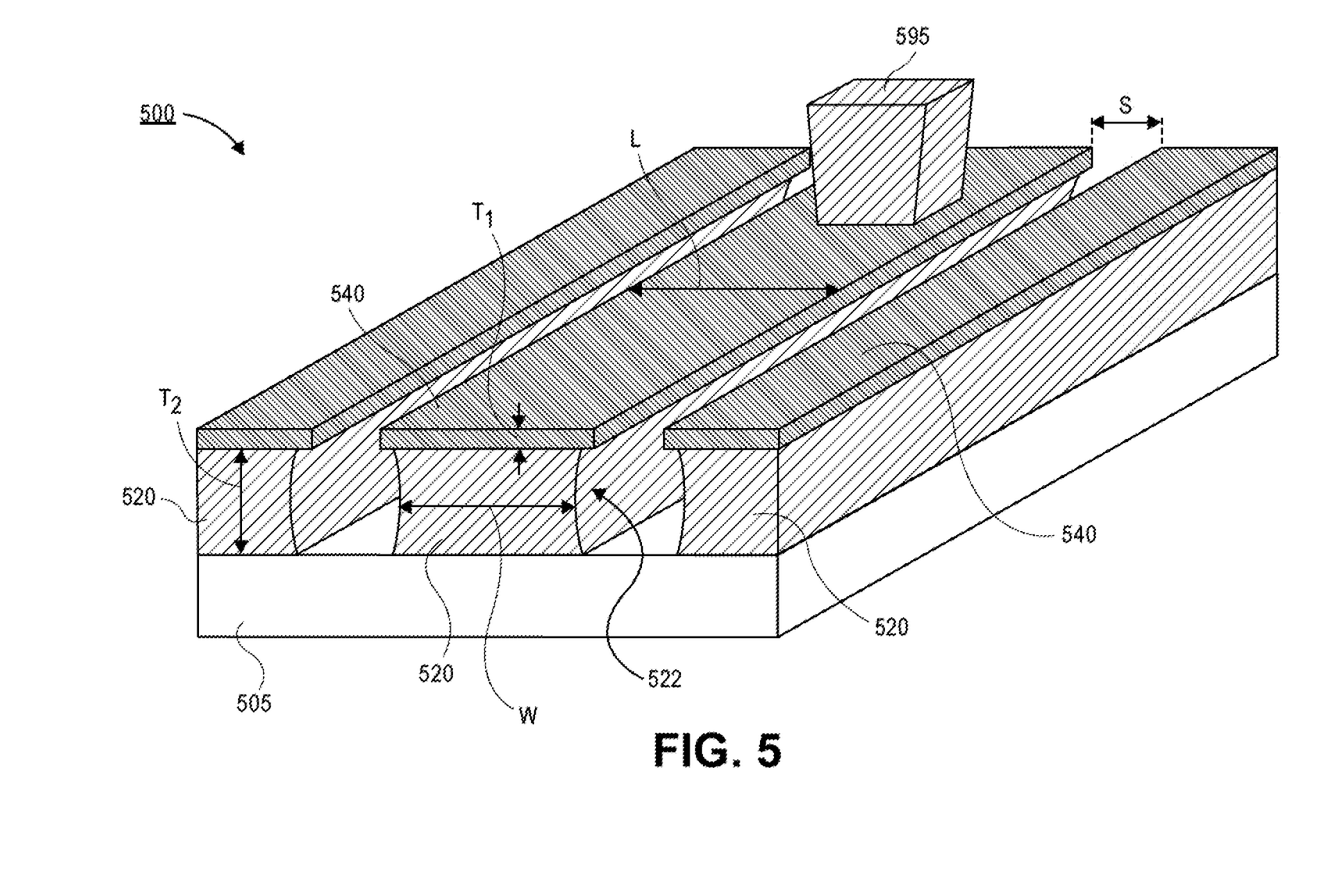
FIG. 5 is a perspective view illustration of a conductive trace with a metallic mask over a top surface of the conductive trace, that illustrates the fine line and spacing attributes attainable by embodiments disclosed herein.

Referring now to FIG. 5, a perspective view illustration of an electronic package 500 is shown, in accordance to an embodiment. The electronic package 500 comprises a substrate 505 and a plurality of conductive features 520 over the substrate 505. In the illustrated embodiment, the conductive features 520 are shown as being conductive traces. However, it is to be appreciated that the conductive features 520 may comprise any conductive feature used in an electronic packaging (e.g., a conductive pad, or the like). In an embodiment, the conductive features 520 may have sidewall surfaces 522 that have a concave profile characteristic of a wet etching process.

As shown, a mask 540 may be positioned over top surfaces of the conductive features 520. The masks 540 may have a line width L that is greater than a width W of the conductive features 520. That is, the masks 540 may extend beyond the sidewall surfaces 522 of the conductive features 520. In an embodiment, the masks 540 may have a first thickness $T_1$ and the conductive features 520 may have a second thickness $T_2$. In an embodiment, the first thickness $T_1$ may be 10 microns or less, 5 microns or less, or 3 microns or less, and the second thickness $T_2$ may be between 10 microns and 35 microns.

In an embodiment, the improved MSR attributable to the alkaline etching chemistry and/or the thin mask 540 allows for a reduction in the minimum lines/space (L/S) attainable in the electronic package 500. For example, the space S between the masks 540 may be less than 40 microns, less than 30 microns, or less than 10 microns. In an embodiment, the ratio of the space S to the first thickness $T_1$ of the masks 540 may be 2:1 or greater, 3:1 or greater, or 5:1 or greater. Generally, increasing the ratio improves flow of reactant species of an etchant through the mask and provides a more efficient etching process. This leads to an improved MSR.

As shown in FIG. 5, one or more vias 595 may land on the metallic mask 540. The vias 595 may provide electrical coupling through dielectric layers (not shown in FIG. 5) for conductive features 520 in different interconnect layers of the electronic package 500. Since the mask 540 is a metallic material, the via 595 may be directly in contact with the mask 540 and still be electrically coupled to the underlying conductive feature 520.

Figure 6:
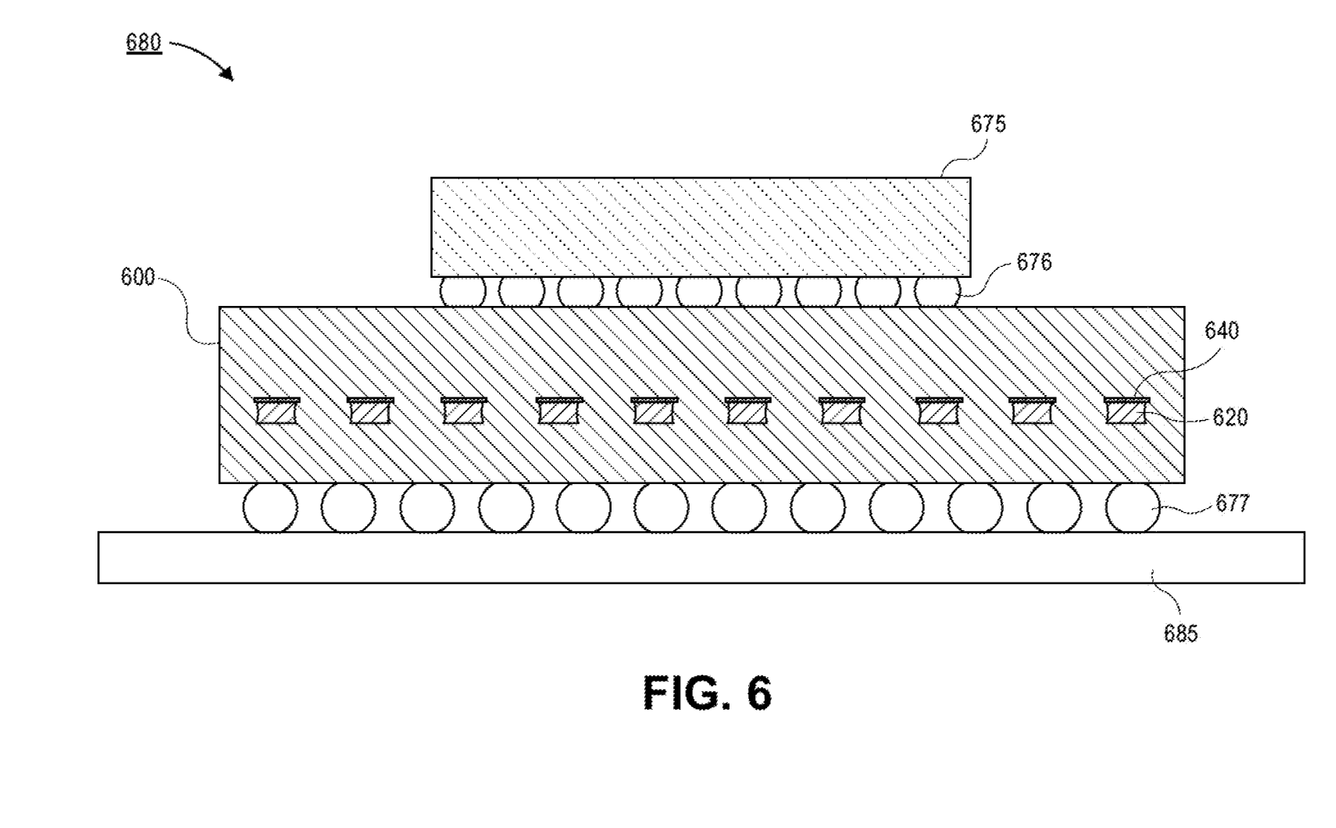
FIG. 6 is a cross-sectional illustration of an electronic system that comprises conductive features with overlying metallic masks, in accordance with an embodiment.

Referring now to FIG. 6, a cross-sectional illustration of a packaged system 680 is shown, in accordance with an embodiment. In an embodiment, the packaged system 680 may include a die 675 electrically coupled to a package substrate 600 with solder bumps 676. In additional embodiments, the die 675 may be electrically coupled to a package substrate 600 with any suitable interconnect architecture, such as wire bonding or the like. The package substrate 600 may be electrically coupled to a board 685, such as a printed circuit board (PCB) with solder bumps 677 or any other suitable interconnect architecture, such as wire bonding or the like.

In an embodiment, a conductive feature 620 with a metallic mask 640 over the conductive feature 620, similar to embodiments described above, may be integrated into the package substrate 600 or the board 685, or the package substrate 600 and the board 685. Embodiments include any number of such conductive features 620 with metallic masks 640 included in the package substrate 600 and the board 685.

Figure 7:
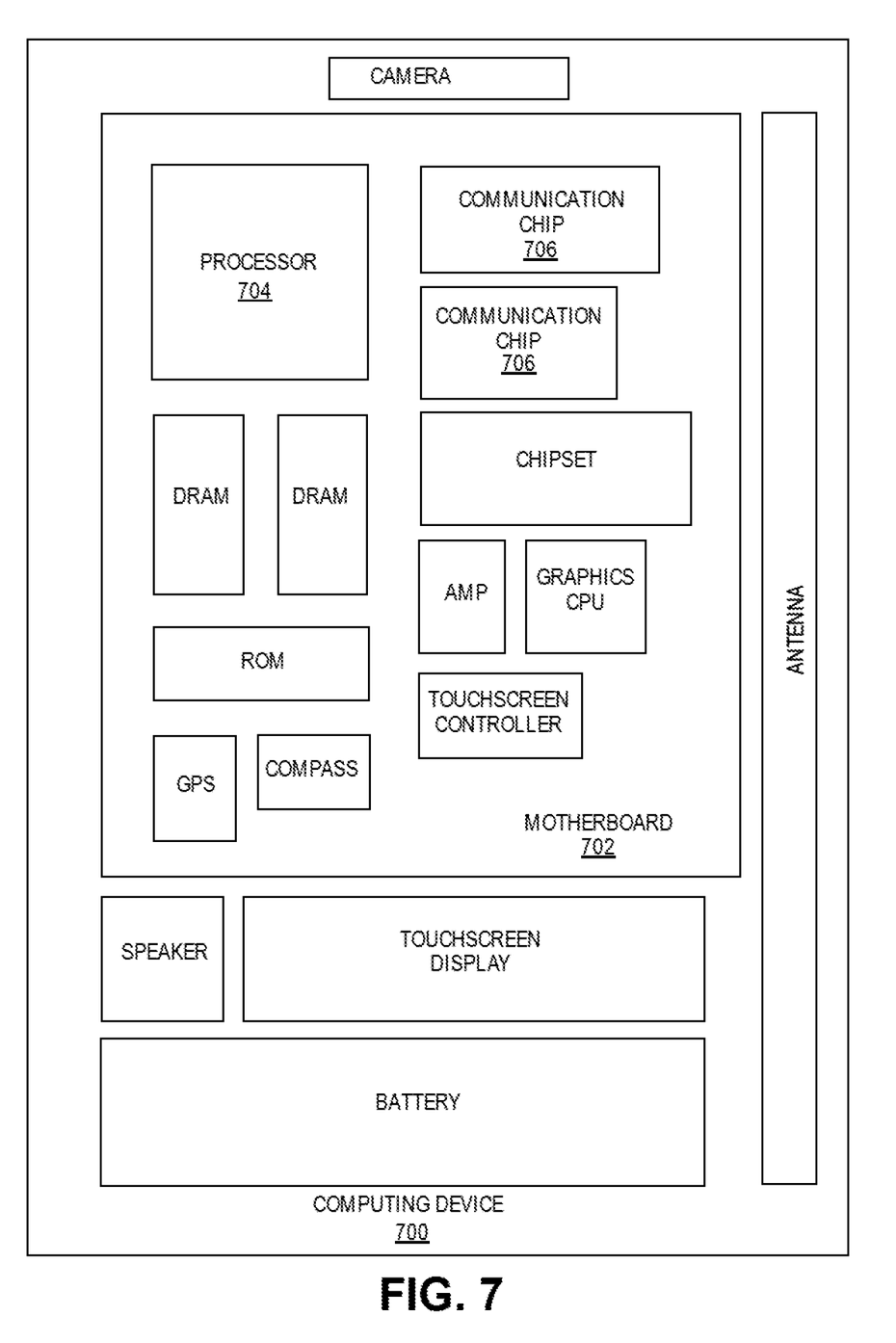
FIG. 7 is a schematic of a computing device built in accordance with an embodiment.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor may be packaged in an electronic system that comprises a package substrate with conductive features and overlying metallic masks, in accordance with embodiments described herein. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip may be packaged in an electronic system that comprises a package substrate with conductive features and overlying metallic masks, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a substrate; a conductive feature over the substrate; and a metallic mask over the conductive feature, wherein the metallic mask extends beyond a first edge of the conductive feature and a second edge of the conductive feature.

Example 2: The electronic package of Example 1, wherein the metallic mask extends beyond the first edge of the conductive feature a first distance, and the metallic mask extends beyond the second edge of the conductive feature a second distance, wherein the first distance is substantially equal to the second distance.

Example 3: the electronic package of Example 1 or Example 2, wherein the first distance is 1 micron or less.

Example 4: the electronic package of Examples 1-3, wherein sidewall surfaces of the conductive feature are non-vertical.

Example 5: the electronic package of Examples 1-4, wherein the sidewall surfaces provide an hour-glass shaped cross-section to the conductive feature.

Example 6: the electronic package of Examples 1-5, wherein a thickness of the metallic mask is approximately 5 microns or less.

Example 7: the electronic package of Examples 1-6, wherein sidewall surfaces of the metallic mask are non-vertical.

Example 8: the electronic package of Examples 1-7, further comprising: a barrier layer between the conductive feature and the metallic mask.

Example 9: the electronic package of Examples 1-8, wherein sidewalls of the barrier layer are substantially coplanar with sidewalls of the metallic mask.

Example 10: the electronic package of Examples 1-9, wherein the barrier layer comprises one or more of tin, gold, and a conductive polymer.

Example 11: the electronic package of Examples 1-10, wherein the metallic mask comprises one or more of nickel, lead, and tin.

Example 12: the electronic package of Examples 1-11, wherein the conductive feature is a trace.

Example 13: the electronic package of Examples 1-12, wherein an etch resistance of the metallic mask in an alkaline chemistry is greater than an etch resistance of the conductive feature in the alkaline chemistry.

Example 14: the electronic package of Examples 1-13, wherein the metallic mask is nickel, and wherein the conductive feature is copper.

Example 15: the electronic package of Examples 1-14, further comprising: a dielectric layer over the substrate and the conductive feature, wherein the dielectric layer conforms to a top surface of the metallic mask, sidewall surfaces of the metallic mask, and a portion of a bottom surface of the metallic mask.

Example 16: an electronic package, comprising: a substrate; a plurality of traces over the substrate, wherein sidewall surfaces of the plurality of traces are non-vertical; and a plurality of metallic masks, wherein each metallic mask is over a top surface of one of the plurality of traces, and wherein each metallic mask extends a distance beyond edges of the underlying one of the plurality of traces.

Example 17: the electronic package of Example 16, wherein a distance between sidewalls of neighboring metallic masks is less than 40 microns.

Example 18: the electronic package of Example 16 or Example 17, wherein a ratio of a distance between sidewalls of neighboring metallic masks to a thickness of the metallic masks is 3:1 or greater.

Example 19: the electronic package of Examples 16-18, wherein a thickness of the metallic mask is approximately 5 microns or less.

Example 20: the electronic package of Examples 16-19, wherein the plurality of metallic masks comprise one or more of nickel, lead, and tin, and wherein the plurality of traces comprise copper.

Example 21: the electronic package of Examples 16-20, further comprising: a barrier layer between the plurality of traces and the plurality of metallic masks.

Example 22: the electronic package of Examples 16-21, wherein sidewalls of the plurality of metallic masks are non-vertical.

Example 23: an electronic system, comprising: a die; and an electronic package coupled to the die, wherein the electronic package comprises: a substrate; a conductive feature over the substrate; and a metallic mask over the conductive feature, wherein the metallic mask extends beyond a first edge of the conductive feature and a second edge of the conductive feature.

Example 24: the electronic system of Example 23, further comprising: a board coupled to the electronic package.

Example 25: the electronic system of Example 23 or Example 24, wherein the metallic mask has a thickness that is approximately 5 microns or less.

What is claimed is:

1. An electronic package, comprising:
   a substrate, the substrate comprising a dielectric layer;
   a conductive feature over the substrate, the conductive feature having a first width proximate to a top portion of the conductive feature, a second width proximate to a middle portion of the conductive feature, and a third width proximate to a bottom portion of the conductive feature, the bottom portion of the conductive feature directly on the dielectric layer of the substrate, wherein the second width is smaller than the first width, and the second width is smaller than the third width; and
   a metallic mask over the conductive feature, wherein the metallic mask extends beyond a first edge of the conductive feature and a second edge of the conductive feature, and wherein the metallic mask has a lateral width greater than a maximum lateral width of the conductive feature.

2. The electronic package of claim 1, wherein the metallic mask extends beyond the first edge of the conductive feature by a first distance, and the metallic mask extends beyond the second edge of the conductive feature by a second distance, wherein the first distance is substantially equal to the second distance.

3. The electronic package of claim 2, wherein the first distance is 1 micron or less.

4. The electronic package of claim 1, wherein sidewall surfaces of the conductive feature are non-vertical.

5. The electronic package of claim 4, wherein the sidewall surfaces provide an hour-glass shaped cross-section to the conductive feature.

6. The electronic package of claim 1, wherein a thickness of the metallic mask is approximately 5 microns or less.

7. The electronic package of claim 1, wherein sidewall surfaces of the metallic mask are non-vertical.

8. The electronic package of claim 1, further comprising:
a barrier layer between the conductive feature and the metallic mask.

9. The electronic package of claim 8, wherein sidewalls of the barrier layer are substantially coplanar with sidewalls of the metallic mask.

10. The electronic package of claim 8, wherein the barrier layer comprises one or more of tin, gold, and a conductive polymer.

11. The electronic package of claim 1, wherein the metallic mask comprises one or more of nickel, lead, and tin.

12. The electronic package of claim 1, wherein the conductive feature is a trace.

13. The electronic package of claim 1, wherein an etch resistance of the metallic mask in an alkaline chemistry is greater than an etch resistance of the conductive feature in the alkaline chemistry.

14. The electronic package of claim 13, wherein the metallic mask is nickel, and wherein the conductive feature is copper.

15. The electronic package of claim 1, further comprising:
a dielectric layer over the substrate and the conductive feature, wherein the dielectric layer conforms to a top surface of the metallic mask, sidewall surfaces of the metallic mask, and a portion of a bottom surface of the metallic mask.

16. An electronic package, comprising:
a substrate, the substrate comprising a dielectric layer;
a plurality of conductive traces over the substrate, wherein sidewall surfaces of the plurality of conductive traces are non-vertical, each one of the plurality of conductive traces having a first width proximate to a top portion of the conductive trace, a second width proximate to a middle portion of the conductive trace, and a third width proximate to a bottom portion of the conductive trace, the bottom portion of the conductive trace directly on the dielectric layer of the substrate, wherein the second width is smaller than the first width, and the second width is smaller than the third width; and
a plurality of metallic masks, wherein each metallic mask is over a top surface of one of the plurality of conductive traces, and wherein each metallic mask extends a distance beyond edges of the underlying one of the plurality of conductive traces, and wherein each metallic mask has a lateral width greater than a maximum lateral width of the underlying one of the plurality of conductive traces.

17. The electronic package of claim 16, wherein a distance between sidewalls of neighboring metallic masks is less than 40 microns.

18. The electronic package of claim 16, wherein a ratio of a distance between sidewalls of neighboring metallic masks to a thickness of the metallic masks is 3:1 or greater.

19. The electronic package of claim 18, wherein a thickness of the metallic mask is approximately 5 microns or less.

20. The electronic package of claim 16, wherein the plurality of metallic masks comprise one or more of nickel, lead, and tin, and wherein the plurality of traces comprise copper.

21. The electronic package of claim 16, further comprising:
a barrier layer between the plurality of traces and the plurality of metallic masks.

22. The electronic package of claim 16, wherein sidewalls of the plurality of metallic masks are non-vertical.

23. An electronic system, comprising:
a die; and
an electronic package coupled to the die, wherein the electronic package comprises:
a substrate, the substrate comprising a dielectric layer;
a conductive feature over the substrate, the conductive feature having a first width proximate to a top portion of the conductive feature, a second width proximate to a middle portion of the conductive feature, and a third width proximate to a bottom portion of the conductive feature, the bottom portion of the conductive feature directly on the dielectric layer of the substrate, wherein the second width is smaller than the first width, and the second width is smaller than the third width; and
a metallic mask over the conductive feature, wherein the metallic mask extends beyond a first edge of the conductive feature and a second edge of the conductive feature, and wherein the metallic mask has a lateral width greater than a maximum lateral width of the conductive feature.

24. The electronic system of claim 23, further comprising:
a board coupled to the electronic package.

25. The electronic system of claim 23, wherein the metallic mask has a thickness that is approximately 5 microns or less.

* * * * *